United States Patent [19]

Tamaru

[11] Patent Number: 4,893,034
[45] Date of Patent: Jan. 9, 1990

[54] STOP/RESTART LATCH

[75] Inventor: Kiichiro Tamaru, Tokyo, Japan

[73] Assignee: Kabushiki Kaisha Toshiba, Kawasaki, Japan

[21] Appl. No.: 155,822

[22] Filed: Feb. 16, 1988

[30] Foreign Application Priority Data

Feb. 19, 1987 [JP] Japan ................................ 62-36730

[51] Int. Cl.$^4$ .................... H03K 17/16; H03K 19/02; H03K 3/284
[52] U.S. Cl. .................................. 307/480; 307/451; 307/511; 307/234; 307/272.1
[58] Field of Search ............... 307/443, 448, 451, 473, 307/480, 511, 530, 234, 272.2

[56] References Cited

PUBLICATIONS

"A 40 ns CMOS E$^2$PROM" Stewart and Plus, IEEE IS SCC 82/Thursday, Feb. 11, 1982.

Primary Examiner—Stanley D. Miller
Assistant Examiner—Margaret Rose Wambach
Attorney, Agent, or Firm—Finnegan, Henderson, Farabow, Garrett and Dunner

[57] ABSTRACT

The logic circuit is disclosed. Even if the system is stopped while an output latch circuit is in the latching state, when an input latch circuit is latching an input signal, the logic gate remains in the precharge mode, whereas the precharge signal as generated by a precharge signal generator circuit is in the "H" level, i.e. a precharge level. Therefore, the logic output from the logic gate is never erased. Within a period that the input and output latch circuits are both in the latching state, the system can be stopped without erasing the logic output.

6 Claims, 2 Drawing Sheets

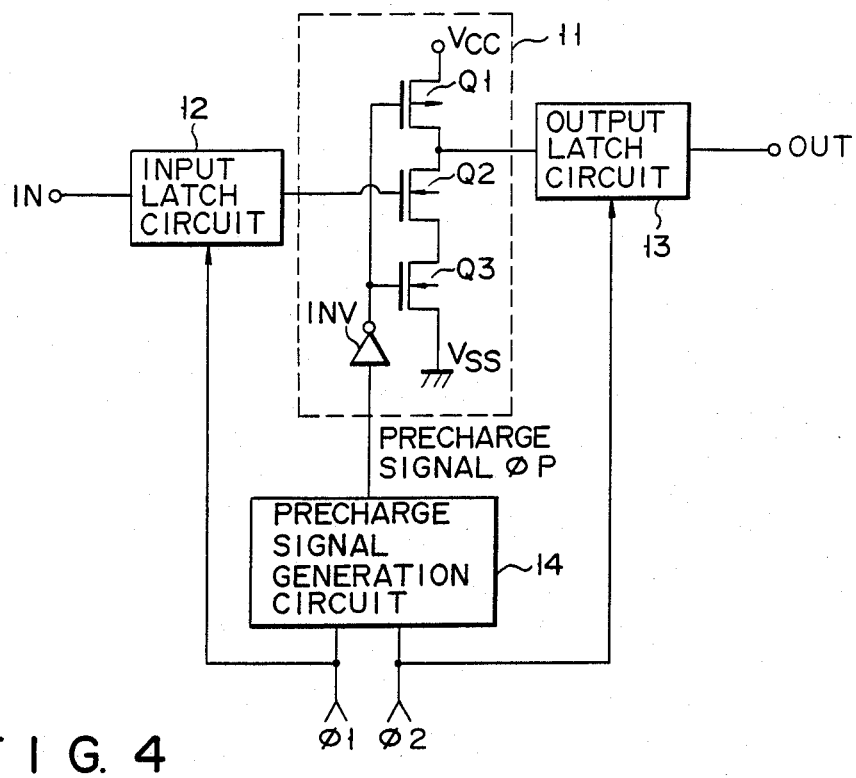
F I G. 4
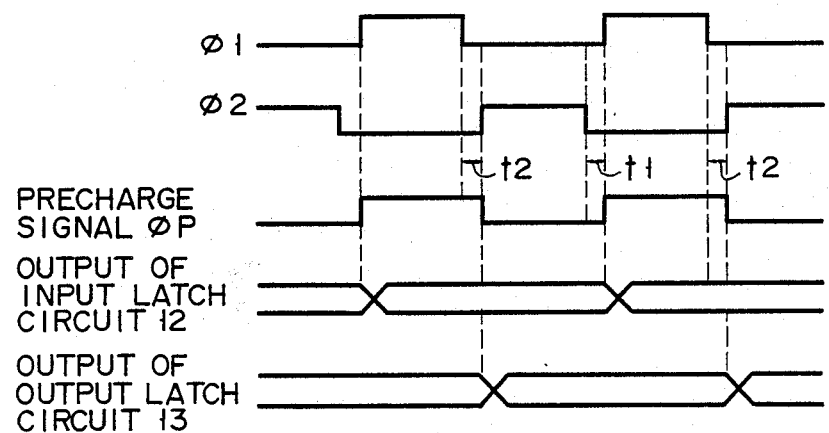
F I G. 5
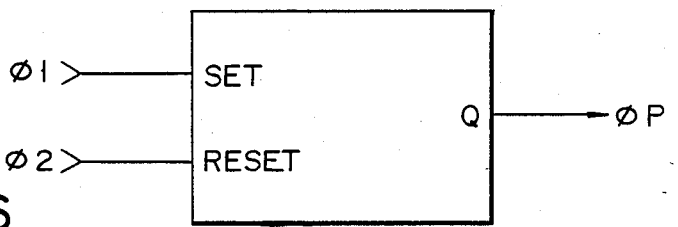
F I G. 6

STOP/RESTART LATCH

BACKGROUND OF THE INVENTION

1. Field of the Invention

This invention relates to a logic circuit of the precharge type, and more particularly to a logic circuit suitable for fabricating a large scale integrated circuit.

2. Description of the related art including information disclosed under §§ 1.97-1.99

In the logic circuit of this type, the output node is precharged according to a precharge signal to a predetermined potential. The potential is changed or kept according to an input signal, so that the logic circuit produces a logic "0" or logic "1" signal. A typical example of the precharge type of logic circuit is shown in FIG. 1. The logic circuit of FIG. 1 is a logic gate 11 constituting an inverter circuit. The logic circuit is made up of P channel MOS (metal oxide semiconductor) transistor Q1 and two N channel MOS transistors Q2 and Q3, and inverter INV. These transistors Q1 to Q3 are connected in series between power potential Vcc terminal and ground potential Vss terminal. The transistors Q1 and Q3 are coupled with precharge signal $\phi1$ via inverter INV, to selectively set logic gate 11 in a precharge mode or in an operation mode according to precharge signal $\phi1$. During a high (H) level period of precharge signal $\phi1$, transistor Q1 is turned on, while transistor Q3 is turned off. The logic gate 11 is in the precharge mode, and its output terminal is at the potential approximate to power potential Vcc. During a low (L) level period, transistor Q1 is turned off, while transistor Q3 is turned on. Its output terminal is at the potential approximate to ground potential Vss.

Input latch circuit 12 is provided at the prestage of the precharge type logic gate 11. This latch circuit 12 latches the input signal at the leading edge of latch signal $\phi1$ as the precharge signal $\phi1$, and outputs the latched signal to logic gate 11. Output latch circuit 13 is provided at the prestage of logic gate 11. This circuit 13 latches the logic output of logic gate 11 at the trailing edge of latch signal $\phi2$, and outputs the latched signal to the next stage circuit.

When a logic gate array is formed of a plurality of logic circuits arrayed on a semiconductor chip in a matrix fashion, each comprising precharge type logic gate 11, input latch circuit 12 and output latch circuit 13, the input latch circuit 12 and the output latch circuit 13 may be transparent type latch circuits as shown in FIG. 2. Such circuits are simple in construction and suitable for a high packing density of the logic gate array.

The latch circuit of the transparent type is made up of clocked inverters 21 and 22, and inverter 23. Clocked inverter 21 is driven by a clock signal $\phi$ to be a latch signal. Clocked inverter 22 is driven by the inverted clock signal $\overline{\phi}$. The latch circuit outputs the input signal during the high level period of latch signal $\phi$, and latches the input signal at the trailing edge of latch signal $\phi$.

When a two-phase clock system of non-overlap phase type is used for the FIG. 1 logic circuit, first and second clock signals $\phi1$ and, having H (high) level periods that are not overlapped with each other are used as the latch signals applied to input latch circuit 12 and output latch circuit 13.

Input latch circuit 12 and output latch circuit 13 latch the input signals at the trailing edges of latch signals $\phi1$ and $\phi2$, respectively. When the system operation is tested, the system is stopped when first and second clock signals $\phi1$ and $\phi2$ are both at a "L" (low) level.

In this case, when the system is stopped during the period t1 (FIG. 3) ranging from the trailing edge of clock signal $\phi2$ to the leading edge of clock signal $\phi1$, input latch circuit 12 is stopped in the latched state of the input signal, and the inverted signal of the signal input to input latch circuit 12 is latched in output latch circuit 13. On the contrary, when the system is stopped during the period t2 (FIG. 3) from the trailing edge of first clock signal $\phi1$ to the leading edge of second clock signal $\phi2$, the logic output from precharge logic circuit 11 is not latched. The reason for this is that output latch circuit 13 has latched the previous logic output during the period t2, and thus the logic output from the precharge type logic circuit 11 is not held. Charges at the output node of logic circuit 11 leak during the inoperative state of the system.

For the above reason, in the conventional logic circuit of the precharge type, the stop/restart period is limited.

SUMMARY OF THE INVENTION

Accordingly, an object of this invention is to provide a logic circuit with a lessened limitation for the stop/restart period, which can be stopped/restarted without erasing the logic output.

According to this invention, there is provided a logic circuit comprising a precharge signal generator driven by first and second clock signals to generate a precharge signal, the precharge signal being in a first level during a period ranging from an instant that a first clock signal changes from the first level to a second level until a second clock signal changes from a first level to a second level, and the precharge signal being in the second level during the remaining periods, first latch circuit driven by the first clock signal to latch the input signal when the first clock signal is changed from the second level to the first level, a logic gate controlled by a precharge signal of the precharge signal generator, the logic gate being placed in the precharge mode when the precharge signal is in the second level, and placed in the operation mode when the precharge signal is in the first level, and the logic gate producing a logic signal in response to the output signal from the first latch circuit, and a second latch circuit driven by the second clock signal to latch the logic output signal from the logic gate when the second clock signal changes from the second level to the first level.

With such an arrangement, even if the system is stopped while the second latch circuit is in the latched state, when the first latch circuit is latching the input signal, the logic gate remains in the precharge mode, whereas the precharge signal generated from precharge signal generator is in the second level at the time of stoppage. The logic output of the logic gate is never erased. Accordingly, during a period that the first and second latch circuits are both latched, the system can be stopped without erasing the logic output.

BRIEF DESCRIPTION OF THE DRAWINGS

FIG. 4 shows a block diagram of a precharge type logic circuit of an embodiment according to this invention;

FIG. 5 shows a signal chart illustrating waveforms of signals at key portions of the FIG. 1 circuit; and FIG. 6 shows a configuration of a precharge signal generator circuit used in the precharge type logic circuit of FIG. 4, in which the generator is an RS flip-flop.

DETAILED DESCRIPTION OF THE PREFERRED EMBODIMENTS

A logic circuit of an embodiment according to this invention will be described.

Figure 1:
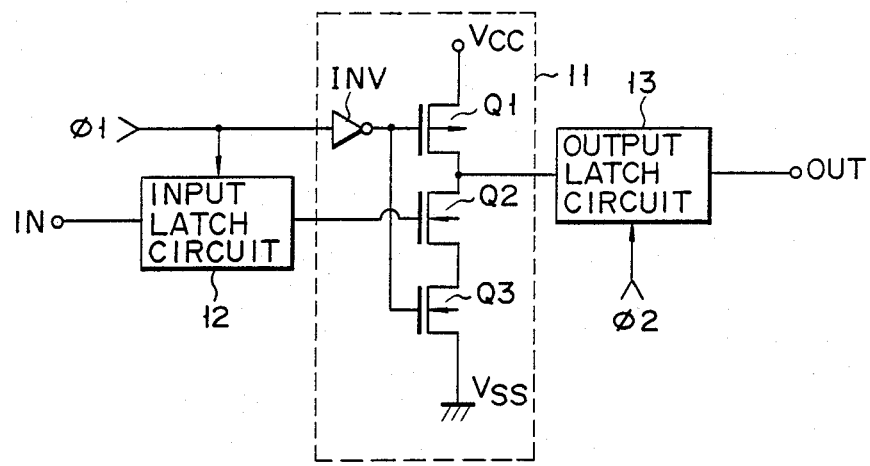
FIG. 1 shows a block diagram of a conventional logic circuit of the precharge type.

In the conventional logic circuit of FIG. 1, clock signal $\phi 1$ as a latch signal input to input latch circuit 12 is used as the precharge signal to precharge type logic gate 11. In other words, the clock signal $\phi 1$ is input, as a precharge signal, to logic gate 11.

Referring to FIG. 4, there is shown a logic circuit according to this invention. In this logic circuit, clock signal $\phi 1$ is not directly input to logic gate 11. A precharge generator circuit 14 is additionally provided. Clock signals $\phi 1$ and $\phi 2$ are input to precharge generator circuit 14. The output signal from the circuit 14 is input, as the precharge signal, to logic gate 11.

The logic circuit of FIG. 4 is an inverter circuit including logic gate 11 of the precharge type. Logic gate 11 is made up of P channel MOS transistor Q1, N channel MOS transistors Q2 and Q3, and inverter INV. These transistors Q1 to Q3 are connected in series between power potential Vcc and ground potential Vss. The transistors Q1 and Q3 are used for selectively placing logic gate 11 in a precharge mode or an operation mode according to precharge signal $\phi p$. Precharge signal $\phi p$ is input to the gates of transistors Q1 and Q3 from precharge signal generator circuit 14, via inverter INV.

During the period in which the precharge signal $\phi p$ is in an "H" level, transistor Q1 is turned on, while transistor Q3 is turned off. Hence, precharge type logic gate 11 is in the precharge mode, and its output terminal is at a potential approximate to the power potential. During the period that the precharge signal $\phi p$ is in an "L" level, transistor Q1 is turned off, while transistor Q3 is turned on. Hence, precharge type logic gate 11 is in the operation mode, and its output terminal is at a potential approximate to ground potential Vss.

Input latch circuit 12 is provided at the prestage of logic gate 11, which latches the input signal at the trailing edge of clock signal $\phi 1$, and applies this latched signal to the logic gate. Output latch circuit 13 is provided at the post-stage of logic gate 11, which latches the logic output from logic gate 11 at the trailing edge of clock signal $\phi 2$, and applies the latched signal to the next stage circuit.

Precharge signal generator circuit 14 produces a signal and applies it, as a precharge signal, to precharge type logic gate 11. The signal from circuit 14 is in an "H" level during the period from the leading edge of first clock signal $\phi 1$ to the leading edge of second clock signal $\phi 2$, and becomes an "L" level signal during the remaining periods. For example, the precharge signal generator circuit 14 may be constructed using an RS flip-flop circuit as shown in FIG. 6, with the first clock signal $\phi 1$ as a set signal and the second clock signal $\phi 2$ as a reset signal. The RS flip-flop circuit is well known, and for this reason no further details will be given.

Figure 2:
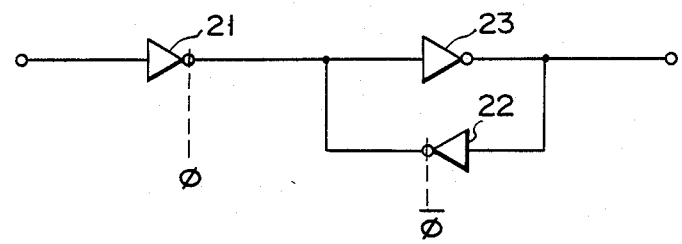
FIG. 2 shows a logic circuit diagram of a latch circuit used in the FIG. 1 logic circuit.
Figure 3:
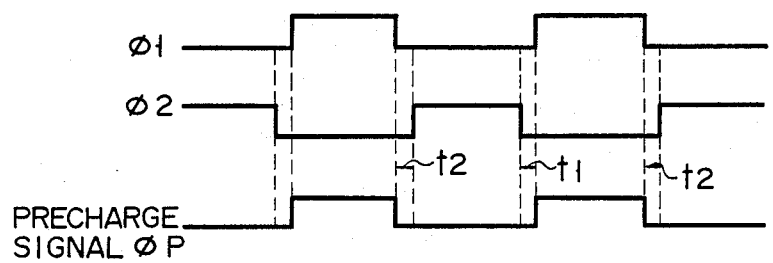
FIG. 3 shows a signal chart illustrating waveforms of signals at key portions of the FIG. 1 circuit.

Input latch circuit 12 and output latch circuit 13 may each be a latch circuit of the transparent type as shown in FIG. 2, whereas this circuit is used in the conventional logic circuit of FIG. 1. Input latch circuit 12 latches the input signal at the trailing edge of first clock signal $\phi 1$. Output latch circuit 13 latches the logic output from logic gate 11 at the trailing edge of second clock signal $\phi 2$.

The operation of the logic circuit of FIG. 4 will be described in reference to the timing chart of FIG. 5.

The "H" level periods of first and second clock signals $\phi 1$ and $\phi 2$ never overlap one another. When first clock signal $\phi 1$ rises, the precharge signal generator circuit produces a precharge signal at an "H" level. Then, precharge type logic gate 11 is placed in the precharge mode. First clock signal $\phi 1$ falls within this precharge period. At this time, input latch circuit 12 latches the input signal. Specifically input latch circuit 12 latches the input signal when precharge type logic gate 11 is in the precharging mode. In turn, second clock signal $\phi 2$ rises, and consequently the precharge signal is in the "L" level. At this time, logic gate 11 is in the operation mode, and produces a logic output signal based on the input signal as latched in input latch circuit 12. When second clock signal $\phi 2$ falls, output latch circuit 13 is in the latched state, and the logic output of logic gate 11 is latched by output latch circuit 13.

Let us assume that the system is stopped during the t2 period from the trailing edge of first clock signal $\phi 1$ to the leading edge of the second clock signal $\phi 2$. Under this circumstance, the input signal is latched in input latch circuit 12. The precharge signal, which is in an "L" level during this period t2 in the conventional logic circuit, is placed in the "H" level in this embodiment. Therefore, precharge type logic gate 11 remains in the precharge mode. When the system is restarted, precharge logic gate 11 is in the operation mode. In this mode, the gate 11 produces a logic output based on the signal as latched in the input latch circuit 12.

Let us assume again that the system is stopped during the period t1 from the trailing edge of second clock signal $\phi 2$ to the leading edge of first clock signal $\phi 1$. In this situation, output latch circuit 13 latches the logic output of logic gate 11, as in the conventional case. Then, when the input signal is latched input latch circuit 12, the system restarts its operation.

As seen from the foregoing, in the logic circuit, the output of the logic gate is never erased during the period in which both the input and output latch circuits 12 and 13 are in the latching state, viz., in both the periods t1 and t2 when both first and second clock signals $\phi 1$ and $\phi 2$ are in the "L" level. Therefore, during such a period the system can be stopped and put in operation again.

Thus, according to this invention, if the input and output latch circuits are both in the latching state, the system can be halted and put back in operation again at any time, without the output signal from logic gate 11 being erased within this period.

What is claimed is:

1. A logic circuit for converting an input signal to a logic output signal, comprising:
   a precharge signal generator driven by first and second clock signals to generate a precharge signal, said precharge signal being in a first level during a period ranging from an instant that the first clock signal changes from the first level to a second level until the second clock signal changes from a first level to a second level, said precharge signal being in the second level during the remaining periods;

first latch circuit means receiving the input signal and being driven by said first clock signal for latching the input signal when the first clock signal is changed from the second level to the first level;

a logic gate controlled by said precharge signal of said precharge signal generator, said logic gate being placed in a precharge mode when said precharge signal is in the second level and being placed in an operation mode when said precharge signal is in the first level, said logic gate producing a logic signal in response to a signal output from said first latch circuit; and second latch circuit means driven by said second clock signal for latching the logic signal output from said logic gate when said second clock signal changes from the second level to the first level.

2. The logic circuit according to claim 1, in which the first level periods of said first and second clock signals do not overlap one another.

3. The logic circuit according to claim 1, in which the first level of each of said first and second clock signals, and said precharge signal is of a low logic level, their respective second levels being of a high logic level.

4. The logic circuit according to claim 1, in which said first and second latch circuits are each of the transparent type.

5. The logic circuit according to claim 1, in which said logic gate includes a first MOS transistor of a first channel type and a second MOS transistor of a second channel type connected in series between a power potential and a reference potential, and an inverter whose input terminal is connected to the output terminal of said precharge signal generator circuit, and whose output terminal is connected to the gates of said first and second MOS transistors, wherein the precharge signal output from said precharge signal generator circuit is level inverted by said inverter, and the level inverted signal is applied to the gates of said first and second MOS transistors.

6. The logic circuit according to claim 1, in which said precharge signal generator is an RS flip-flop circuit, coupled at the set terminal with said first clock signal, at the reset terminal with said second clock signal, and produces said precharge signal at the output terminal.

* * * * *